United States Patent
Stopper et al.

(10) Patent No.: US 10,406,562 B2
(45) Date of Patent: Sep. 10, 2019

(54) AUTOMATION FOR ROTARY SORTERS

(71) Applicant: Applied Materials, Inc., Santa Clara, CA (US)

(72) Inventors: Markus J. Stopper, Voerstetten (DE); Asaf Schlezinger, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 28 days.

(21) Appl. No.: 15/708,943

(22) Filed: Sep. 19, 2017

(65) Prior Publication Data

US 2019/0022705 A1    Jan. 24, 2019

Related U.S. Application Data

(60) Provisional application No. 62/535,270, filed on Jul. 21, 2017.

(51) Int. Cl.
*H01L 21/677* (2006.01)
*B07C 5/36* (2006.01)

(52) U.S. Cl.
CPC .............. *B07C 5/362* (2013.01); *B07C 5/36* (2013.01); *H01L 21/67763* (2013.01); *H01L 21/67766* (2013.01); *B07C 2501/0063* (2013.01)

(58) Field of Classification Search
CPC ............ B07C 5/362; B07C 2501/0063; H01L 21/6773; H01L 21/67763; H01L 21/67766; H01L 21/67775; H01L 21/67781; H01L 22/10; H01L 22/20
See application file for complete search history.

(56) References Cited

U.S. PATENT DOCUMENTS

| | | | | |
|---|---|---|---|---|
| 5,664,337 | A | * | 9/1997 | Davis ................ H01L 21/67173 34/184 |
| 5,934,856 | A | * | 8/1999 | Asakawa ................ C23C 16/54 414/217 |
| 6,050,768 | A | * | 4/2000 | Iwasaki ............. H01L 21/67276 414/222.01 |
| 6,672,820 | B1 | * | 1/2004 | Hanson .................... C25D 7/12 414/222.06 |
| 7,780,020 | B2 | * | 8/2010 | Yoshitaka .............. B65G 37/02 212/332 |
| 8,827,618 | B2 | * | 9/2014 | Babbs ................... H01L 21/673 414/217.1 |

(Continued)

FOREIGN PATENT DOCUMENTS

| | | |
|---|---|---|
| FR | 3040900 A1 | 3/2017 |
| WO | 2013117246 A1 | 8/2013 |

OTHER PUBLICATIONS

Communication Substantive Search Report dated Mar. 16, 2018 for Application No. 17192632.2.

(Continued)

*Primary Examiner* — Joseph C Rodriguez
(74) *Attorney, Agent, or Firm* — Patterson + Sheridan LLP

(57) ABSTRACT

In one example, a sorting unit includes a sorting system and a plurality of bins into which substrates are sorted. The sorting unit includes a bin handler having a first end effector for receiving one bin of the plurality of bins, and second end effector for disposing an empty bin in the previous location of the received bin. In one example, a method of operating a sorting unit is also provided.

17 Claims, 4 Drawing Sheets

(56) References Cited

U.S. PATENT DOCUMENTS

| | | | |
|---|---|---|---|
| 8,944,738 B2* | 2/2015 | van der Meulen | B25J 9/042 414/217 |
| 8,948,908 B2* | 2/2015 | Nomura | H01L 21/67766 211/41.18 |
| 9,147,592 B2* | 9/2015 | Englhardt | H01L 21/67739 |
| 9,168,930 B2* | 10/2015 | Wada | H01L 21/67733 |
| 9,341,580 B2* | 5/2016 | Schlezinger | H02S 50/00 |
| 9,728,434 B2* | 8/2017 | Inagaki | H01L 21/67733 |
| 9,818,633 B2* | 11/2017 | Lill | H01L 21/67766 |
| 9,842,756 B2* | 12/2017 | Bonora | H01L 21/67766 |
| 2002/0125177 A1 | 9/2002 | Burns et al. | |
| 2007/0269302 A1* | 11/2007 | Kim | B25J 9/042 414/744.1 |
| 2009/0060697 A1* | 3/2009 | Wakabayashi | H01L 21/67733 414/564 |
| 2016/0325946 A1 | 11/2016 | Stopper et al. | |
| 2017/0170041 A1 | 6/2017 | Stopper et al. | |

OTHER PUBLICATIONS

Taiwan Office Action dated Feb. 5, 2018 for Application No. 106214778.

* cited by examiner

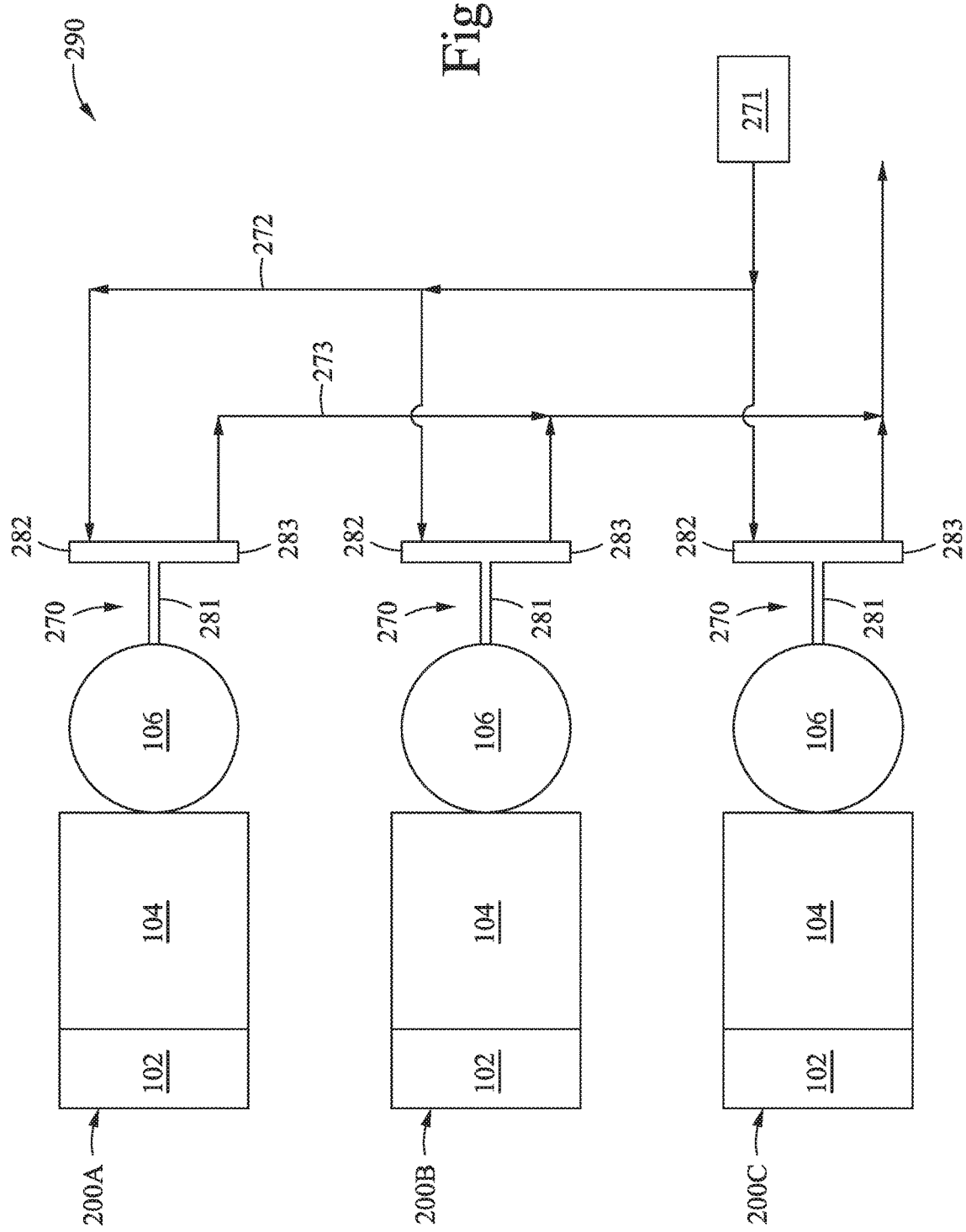

US 10,406,562 B2

AUTOMATION FOR ROTARY SORTERS

CROSS-REFERENCE TO RELATED APPLICATIONS

This application claims benefit of U.S. Provisional Patent Application Ser. No. 62/535,270, filed Jul. 21, 2017, which is herein incorporated by reference.

BACKGROUND

Field

Aspects of the present disclosure generally relate to loading and unloading of bins from sorting devices, such as rotary sorting units.

Description of the Related Art

Sorting units, such as rotary sorters, are used to sort substrates based on inspection criteria. The inspected substrates are placed in one of a plurality of bins by the sorting unit based on the inspection criteria. Once a bin is filled with sorted substrates, the full bin is removed and replaced with an empty bin to facilitate additional sorting of substrates. The removal of the full bin and the replacement with the empty bin are conventionally operations which are performed manually by an operator.

However, manual removal and replacement suffers from several drawbacks. For example, if a full bin is not removed in time, it is possible that the sorting unit will overload the bin, or attempt to overload the bin, resulting in substrate damage. Additionally, if a replacement bin is not positioned in time to receive a sorted substrate, damage to the sorted substrate may also occur. In conventional operations where the rotary sorter may be halted to allow removal and replacement of bins without substrate damage, throughput is decreased.

Therefore, what is needed is an improved method of and apparatus for loading and unloading bins of sorting units.

SUMMARY

In one example, a sorting unit includes a sorting system and a plurality of bins into which substrates are sorted by the sorting system. The sorting unit also includes a bin handler having a first end effector for receiving one bin of the plurality of bins, and second end effector for disposing an empty bin in the previous location of the received bin.

In another example, an inspecting system comprises a loading unit, a modular unit including one or more metrology stations, and a sorting unit. The sorting unit includes a sorting system, a plurality of bins into which substrates are sorted by the sorting system, a bin handler. The bin handler has a first end effector for receiving one bin of the plurality of bins, and second end effector for disposing an empty bin in the previous location of the received bin.

In one example, a method of operating a sorting unit includes sorting a plurality of substrates into a respective bin of a plurality of bins based on inspection criteria, and determining that one of the bins of the plurality of bins is in a full or near-full state. In response to the determination, an empty bin is engaged with a first end effector of a bin handler, and the bin handler with the empty bin is moved adjacent to the full or near-full bin. The full or near-full bin is engaged with a second end effector of the bin handler, and the full or near-full bin is replaced with the empty bin.

BRIEF DESCRIPTION OF THE DRAWINGS

So that the manner in which the above recited features of the present disclosure can be understood in detail, a more particular description of the disclosure, briefly summarized above, may be had by reference to aspects, some of which are illustrated in the appended drawings. It is to be noted, however, that the appended drawings illustrate only exemplary aspects and are therefore not to be considered limiting of scope, as the disclosure may admit to other equally effective aspects.

FIG. 2 is a schematic plan view of a fabrication plant, according to one aspect of the disclosure.

To facilitate understanding, identical reference numerals have been used, where possible, to designate identical elements that are common to the figures. It is contemplated that elements and features of one aspect may be beneficially incorporated in other aspects without further recitation.

DETAILED DESCRIPTION

In one example, a sorting unit includes a sorting system and a plurality of bins into which substrates are sorted by the sorting system. The sorting unit also includes a bin handler having a first end effector for receiving one bin of the plurality of bins, and second end effector for disposing an empty bin in the previous location of the received bin. In one example, a method of operating a sorting unit includes sorting a plurality of substrates into a respective bin of a plurality of bins based on inspection criteria, and determining that one of the bins of the plurality of bins is in a full or near-full state. In response to the determination, an empty bin is engaged with a first end effector of a bin handler, and the bin handler with the empty bin is moved adjacent to the full or near-full bin. The full or near-full bin is engaged with a second end effector of the bin handler, and the full or near-full bin is replaced with the empty bin.

Figure 1A:
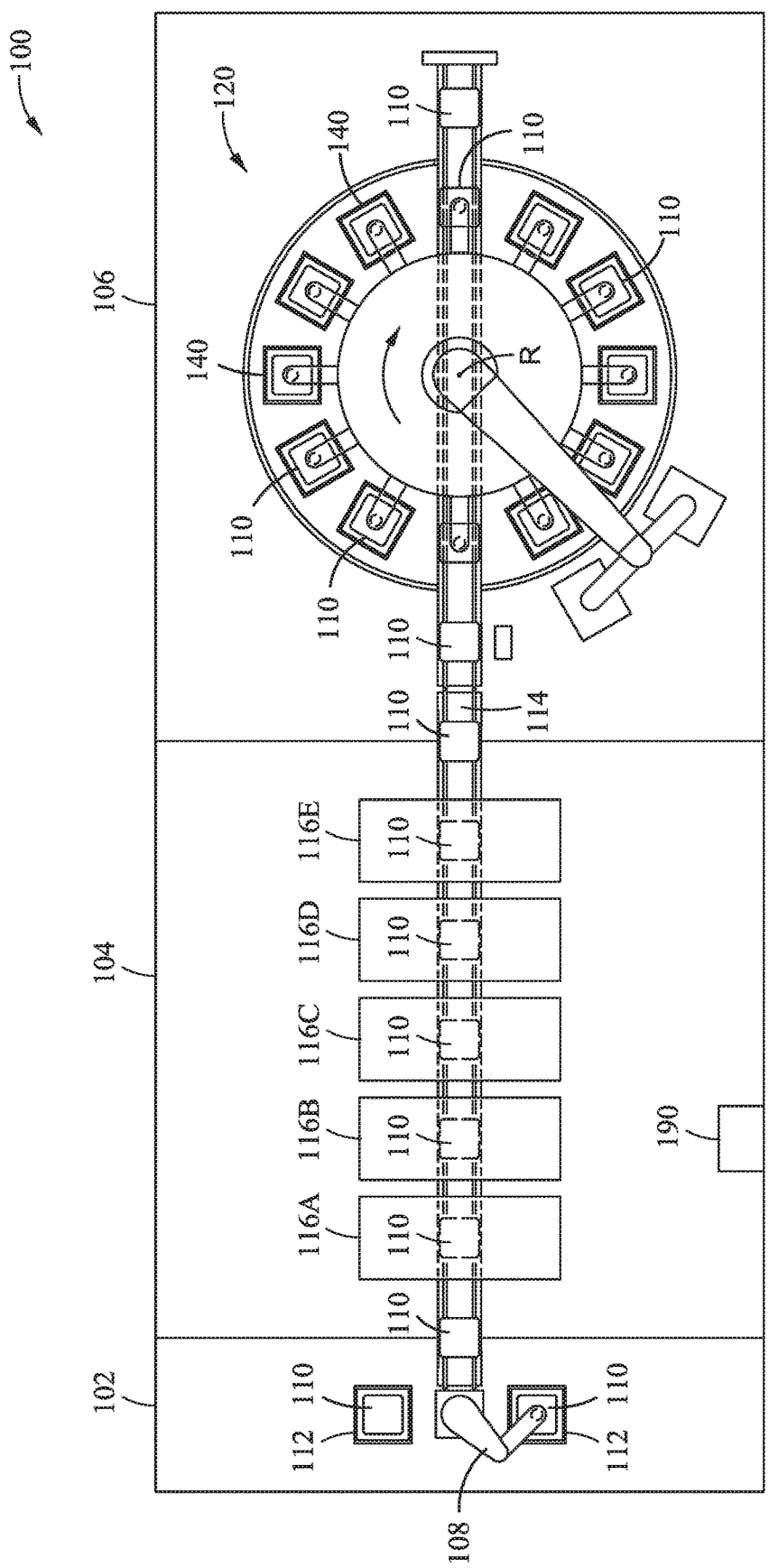
FIG. 1A is a schematic top plan view of an inspection system, according to one aspect of the disclosure.
Figure 1B:
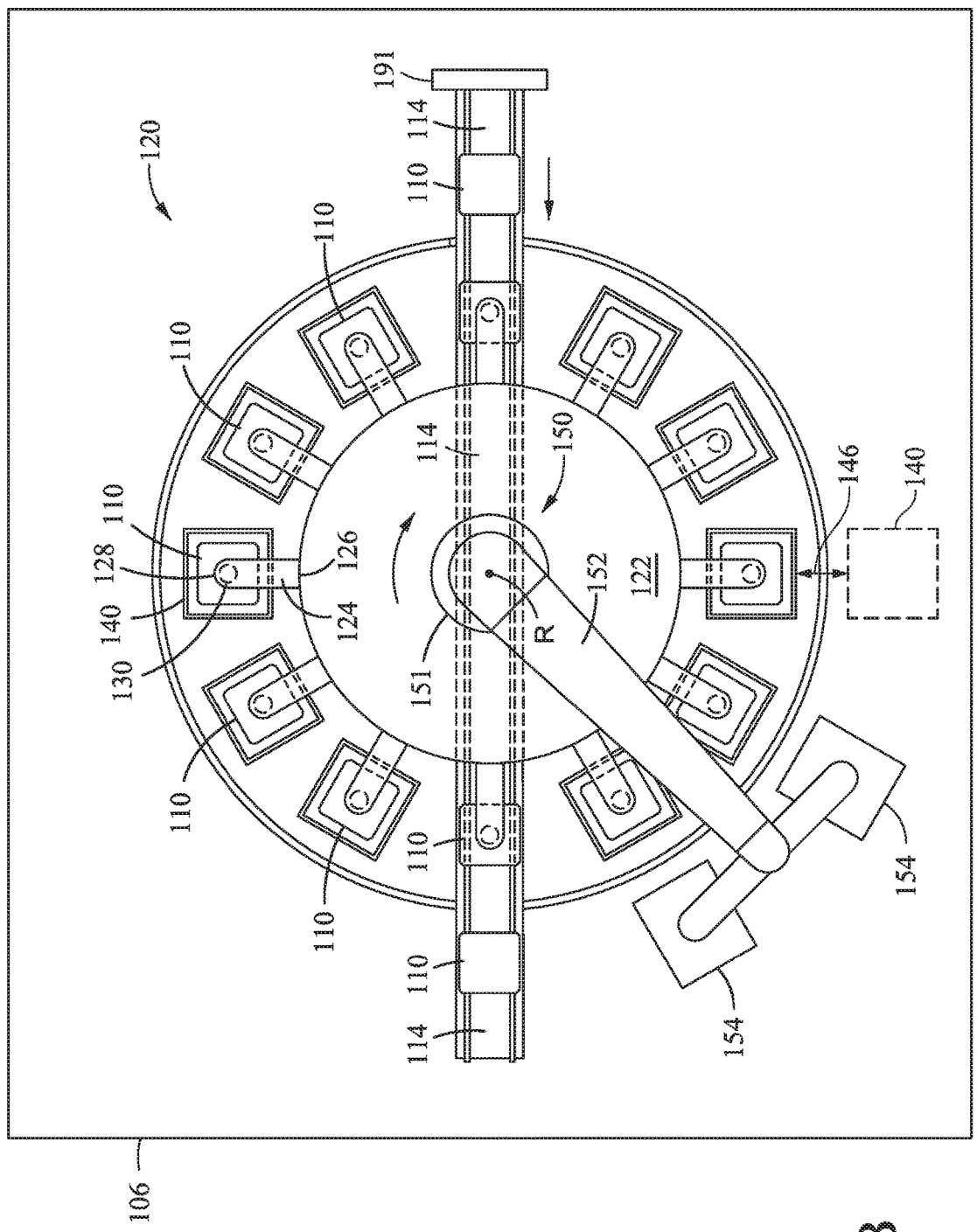
FIG. 1B is a schematic top plan view of a high speed rotary sorter of the inspection system of FIG. 1A, according to one aspect of the disclosure.
Figure 1C:
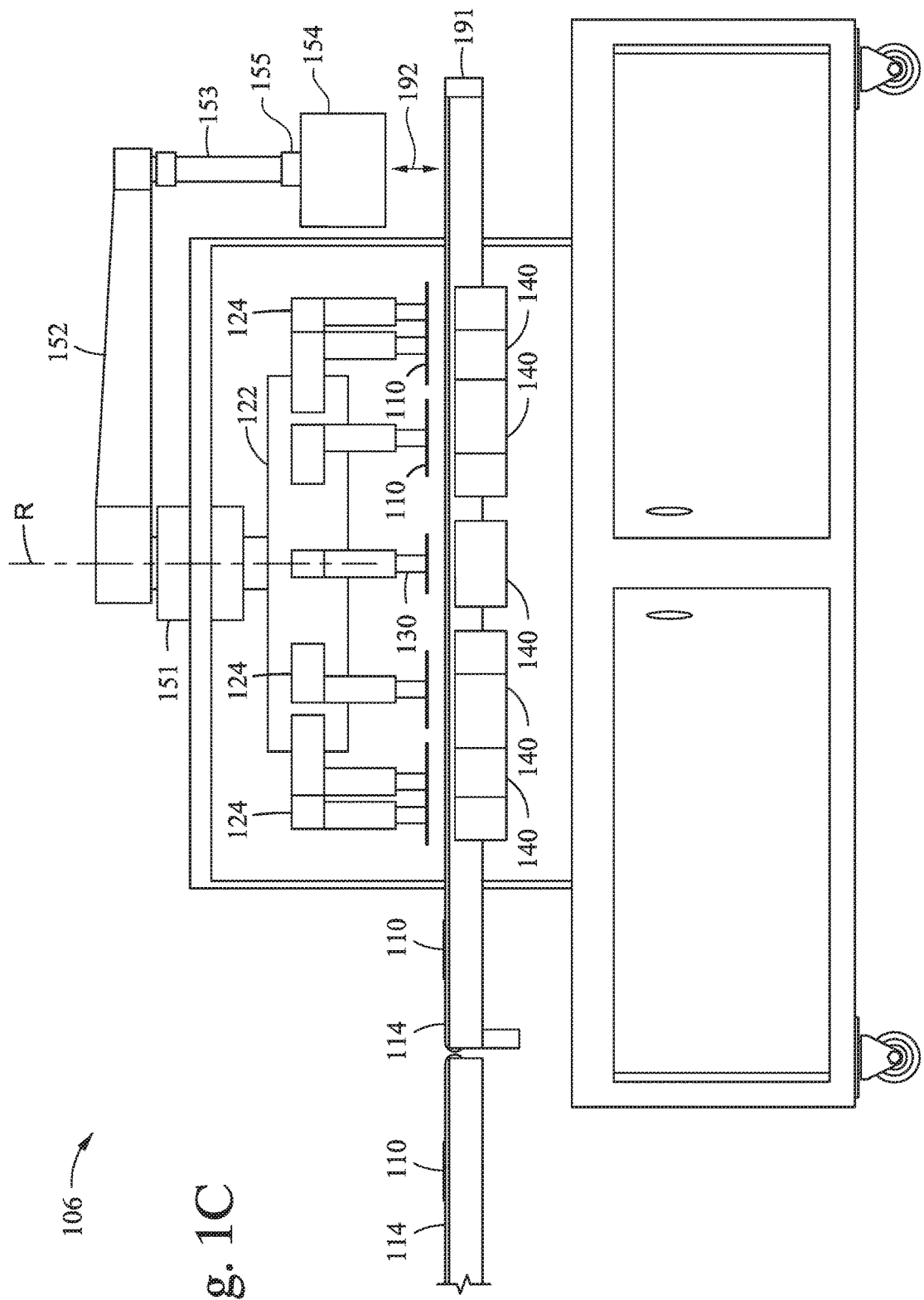
FIG. 1C is a schematic side view of the high speed rotary sorter of FIG. 1B, according to one aspect of the disclosure.

FIG. 1A illustrates a top plan view of an inspection system 100, according to one aspect. FIG. 1B illustrates a top plan view of a sorting unit 106 of the inspection system 100 of FIG. 1A, according to one aspect. FIG. 1C is a schematic side view of the rotary sorter of FIG. 1B, according to one aspect. To facilitate explanation, FIGS. 1A-1C will be explained in conjunction.

The inspection system 100 includes a front end 102, a modular unit 104, and a sorting unit 106. The front end 102 may be, for example, a loading unit. The front end 102 facilitates transfer of substrates 110 from loading cassettes 112 to the modular unit 104 via a robot 108. The robot 108 positions substrates 110 on a conveyor system 114 which transfers the substrates though the modular unit 104 and to the sorting unit 106

The modular unit 104 may be, for example, a metrology unit, and may include one or more metrology stations. In the aspect of FIGS. 1A-1C, the modular unit 104 includes five metrology stations 116A-116E, configured to inspect a substrate 110 as the substrate 110 is transferred through the modular unit 104 on the conveyor system 114. It is contemplated that the inspection system 100 may also be modified by adding or subtracting metrology stations to the modular unit 104. The metrology stations may include, for example, any of the following: a micro-crack inspection unit, a thickness measuring unit, a resistivity measuring unit, a photoluminescence unit, a geometry inspection unit, a saw mark detection unit, a stain detection unit, a chip detection unit, and/or a crystal fraction detection unit. The micro-crack inspection unit may be configured to inspect substrates for cracks, as well as to optionally determine crystal fraction of a substrate. The geometry inspection unit may be configured to analyze surface properties of a substrate. The saw mark detection unit may be configured to identify saw marks including groove, step, and double step marks on a substrate. It is contemplated that other metrology stations not listed above may also be utilized.

Upon completion of substrate inspection in the modular unit 104, substrates 110 are transferred by the conveyor system 114 to the sorting unit 106 in order to be sorted based on inspection results. To facilitate sorting, substrates 110 are delivered to a rotary sorting system 120 housed within sorting unit 106. In one example, the conveyor system 114 may continue through the sorting unit 106 to a connector 191 thus allowing substrates 110 to bypass the rotary sorting system 120, for example, to another system. Additionally or alternatively, the connector 191 may be coupled to another conveyor system. In such an example, bins 140 may be loaded onto the conveyor 114 adjacent the connector 191 to facilitate transfer of bins to (or to be received from) another conveyor system.

The inspection system 100 may also include a controller 190. The controller facilitates the control and automation of the system 100. The controller 190 may be coupled to or in communication with one or more of the conveyor system 114, the front end 102, the modular unit 104, the sorting unit 106, the transfer robot 108, and/or the metrology stations 116A-116E. The inspection system 100 may provide information to the controller 190 regarding substrate movement, substrate transferring, substrate sorting, and/or metrology performed.

The controller 190 includes a central processing unit (CPU), memory, and support circuits (or I/O). The CPU may be one of any form of computer processors that are used in industrial settings for controlling various processes and hardware (e.g., pattern generators, motors, and other hardware) and monitor the processes (e.g., processing time and substrate position or location). The memory is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits are also connected to the CPU for supporting the processor. The support circuits may include cache, power supplies, clock circuits, input/output circuitry, subsystems, and the like. A program (or computer instructions) readable by the controller 190 determines which tasks are performable on a substrate. The program may be software readable by the CPU and may include code to monitor and control, for example, the processing time and substrate position or location within the inspection system 100.

FIG. 1B illustrates a top plan view of the sorting unit 106 of the inspection system 100 of FIG. 1A, according to one aspect. The sorting unit 106 includes a rotary sorting system 120 having a rotatable support 122 with a rotational axis R. The rotatable support 122 may be a rotary disc, a circular support, or any other shape for efficiently sorting substrates 110. The rotatable support 122 includes a plurality of arms 124. Each arm 124 has a first end 126 and a second end 128. The first end 126 of each arm 124 is coupled to the rotatable support 122, and the second end 128 of each arm 124 extends radially outward relative to the rotational axis R. At least one gripper 130 is coupled to the second end 128 of each arm 124. Each gripper 130 may be disposed on a bottom side of each of the arms 124 so that each gripper 130 may grab a substrate 110 once the inspected substrate 110 reaches the sorting unit 106. In one aspect, the rotatable support 122 includes at least twelve arms 124, such as fourteen arms or sixteen arms; however it is contemplated that any number of arms 124 may be utilized.

One or more sorting bins 140 are disposed radially outward of the rotational axis R. The sorting bins 140 are positioned directly below the path taken by the grippers 130 to facilitate transfer of a substrate 110 to the sorting bins 140 by the grippers. In one aspect, at least ten sorting bins 140 are utilized; however it is contemplated that any number of sorting bins 140 may be utilized. In another aspect, the number of grippers 130 is equal to the number of bins 140. The number of substrates 110 in any particular bin 140 at any time may be tracked by the controller 190. For example, the number of substrates 110 may be determined by a counter, or by weight.

In one mode of operation, the rotary sorting system 120 rotates about the rotational axis R in a stepping fashion such that the rotary sorting system 120 stops to grip (e.g., pick up) a substrate 110 from the conveyor system 114 as each substrate 110 enters the sorting unit 106. The sorting bins 140 are positioned to receive substrates 110 from the rotary sorting system 120 via grippers 130. The rotary sorting system 120 positions the gripped substrates 110 over a sorting bin 140 assigned to receive substrates having at least one predefined substrate characteristic. The substrate 110 is then released from the respective gripper(s) 130 into the appropriate sorting bin 140. The sorting bins 140 may store the sorted substrates 110 as released by the grippers 130. The substrates 110 are sorted into the sorting bins 140 in response to one or more substrate characteristics determined during one or more of the inspection processes performed in the metrology stations 116A-116E.

The rotatable support 122 is coupled with a rotary actuator (not shown), such as a pneumatic cylinder or stepper motor. The rotary actuator rotates the rotatable support 122 to index the rotatable support 122. Upon each indexing step of the rotatable support 122, a new substrate 110 is received from the modular unit 104 via the conveyor system 114 onto the rotary sorting system 120 via each gripper 130. Additionally, the rotatable support 122 indexes each of the plurality of arms 124 over a respective sorting bin 140, such that substrates 110 may be released into a specified sorting bin 140. By continually moving, or index stepping, substrates 110 may be continuously removed from the conveyor system 114, thus immediately freeing the space on the conveyor system 114 for a subsequent substrate 110. As such, the rotary motion allows each gripper 130 to interface with each sorting bin 140 so that the substrate held by the grippers 130 will be released into one of the sorting bins 140 prior to the grippers 130 rotating back to a position to receive another substrate 110. The rotary sorting system 120 will continue to move until all substrates 110 have been sorted.

The sorting bins 140 are each individually removable from the sorting unit 106. Each sorting bin 140 may be removably connected with the sorting unit 106 such as, by way of example only, an individually removable drawer or container, a slide out vessel, or pull out drawer or container, which may actuate radially outward from beneath the grippers 130 to facilitate access to a respective sorting bin 140.

The sorting unit 106 also includes bin handler 150. The bin handler 150 includes a rotational actuator 151 coaxially aligned with the rotational axis R, a horizontal cross bar 152 coupled to the rotational actuator and extending radially outward from the rotational actuator 151, a coupling member 153, and one or more end effectors 154. The rotational actuator 151 is coupled to a frame member, but alternatively, may be coupled to a vertical support post aligned with the rotational axis R. The coupling member 153 extends downward from a radially outward end of the cross bar 152. A lower end of the coupling member 153 is coupled to one or more end effectors 154 via one or more optional actuators 155. The actuators 155 facilitate vertical movement as shown by arrow 192 for engagement and disengagement with bins 140. Rotational actuation of the rotational actuator 151 results in actuation of the end effectors 154 about the perimeter of the bins 140. The end effectors 154 are positioned radially outward of and rotate about the bins 140. The end effectors 154 are configured to remove and replace bins 140 from the sorting unit 106. In one example, a first end effector 154 of the bin handler 150 removes a full bin 140, while a second end effector 154 positions an empty bin 140 in the newly-vacant bin location. The end effectors 154 may include one or more grippers, fingers, claws, male/female engagement surfaces, or other mechanisms configured to engage a bin 140.

During operation, the bin handler 150 removes full bins 140 and replaces the full bin 140 with an empty bin 140. In one example, a first end effector 154 of the bin handler 150 removes the full bin 140, while a second end effector 154 positions an empty bin 140 in the newly-vacant bin location. The determination of when to remove and replace a bin 140 may be made by the controller 190. The controller 190 may keep a count of how many substrates 110 have been sorted into a particular bin 140, or alternatively, the controller 190 may receive a signal from a sensor, such as an optical sensor or a scale, that indicates the number of substrates in a particular bin 140. As a bin 140 approaches a maximum amount of substrates 110 therein, the controller instructions the bin handler 150 to obtain an empty bin 140, and then to subsequently move to a radial position adjacent the nearly-full bin.

Once the bin 140 is full, the full bin 140 may be ejected to a position to be engaged by an end effector 154 of the bin handler 150. Ejection may occur in response to a signal from the controller 190. Ejection may include one or more of opening a drawer, container, or cover, and moving the bin radially outward from a respective substrate loading position to a radial position beneath an end effector 154. In another example, it is contemplated that a physical ejection process is not necessary to be performed to allow an end effector 154 to engage a remove a bin 140.

Once the bin 140 is ejected, the end effector 154 engages the bin 140, and rotates to move the coupled bin away from the loading position. When rotating, an empty bin 140, held by a second end effector 154, is moved adjacent to a substrate loading position for the previously-removed bin 140, and the empty bin 140 is disposed in the position of the previously-moved full bin 140. In such a manner, the full bin 140 is replaced with an empty bin 140. The empty bin 140 is then retracted into position (e.g., opposite the ejection operation) to allow sorting of substrates into the empty bin 140. In other words, a full bin 140 is ejected while positioned on a drawer (or platform, or similar support surface) which actuates radially outward and inward (to facilitate ejection and loading, respectively) of a bin 140. A full or near-full bin 140 is ejected outward on the drawer to a position beneath a first end effector 154, and engaged by the first end effector 154. A send end effector 154 is rotated into position over the now-empty drawer, and positions an empty bin 140 onto the drawer, which is then retracted radially inward to accept substrates 110 from the grippers 130. Arrow 146 illustrates radially inward and radially outward movement of a bin 140, shown in phantom.

In an alternative example, it is contemplated that the full bin 140 is not ejected and the empty bin 140 is not retracted to facilitate an exchange therebetween. Rather, in such an example, the bin handler 150 removes and replaces bins 140 without any ejection/retraction operation. For example, a door may be positioned adjacent each bin 140. In such an example, the door may open to allow access to the rotary sorting system 120 and the bins 140 thereof. In such an example, the bins 140 are removed and replaced through an open door via the end effectors 154.

In another example, the bins 140 are positioned radially inward of the end effectors 154 when engaged by the end effectors 154, rather than being located vertically beneath the end effectors 154 when being engaged by the end effectors 154. In one example, the sorting of substrates 110 continues even though a particular sorting bin 140 is full or has been removed. Therefore, each sorting bin 140 may be emptied or replaced while sorting is occurring, thus preventing downtime of the sorting unit 106. In another example, bins 140 into which a high volume of substrates 110 are sorted may include a duplicate or back-up sorting bin 140, such that when a primary bin 140 is removed, substrates are sorted into a secondary bin 140. In such an example, the primary and secondary bins 140 may each hold substrates having the same designated inspection criteria, but only one bin 140 may be loaded at a time. Because only one of the primary or the secondary bins 140 are loaded at a time, the other of primary or secondary bin 140 may be removed and replaced according to aspects disclosed herein. In doing so, the likelihood that a substrate 110 will be sorted to a bin location during a bin removal/replacement operation is mitigated, thus reducing the likelihood of substrate damage.

FIG. 2 is a schematic plan view of a fabrication plant 290, according to one aspect of the disclosure. To facilitate explanation of FIG. 2, reference may be made to FIGS. 1A-1C.

The fabrication plant 290 includes one or more inspection systems 200A-200C (three are shown). Each of the inspection systems 200A-200C is similar to the inspection system 100 described above, and includes a front end 102, a modular unit 104, and a sorting unit 106. Each of the inspection systems 200A-200C is positioned adjacent an exchange conveyor 270. During operation, a bin handler 150 (shown in FIGS. 1B and 1C) receives empty bins from the exchange conveyor 270 and deposits full bins onto the exchange conveyor 270. A first end of each exchange conveyor is positioned to interface with a respective bin handler 150, while remaining ends 281, 282 of the exchange handler interface with a conveyor 272 and a conveyor 273, respectively. In one example, the bin handler 150 is operatively coupled to the exchange conveyor 270 via the connector 191. In another example, the connector 191 is part of the exchange conveyor 270.

During operation, empty bins are provided to the exchange conveyor 270 from a source 271 via a conveyor 272. The conveyor 272 is in communication with each exchange conveyor 270 of the one or more inspection systems 200A-200C. Once an empty bin is delivered to an end 282 of the exchange conveyor 270, the exchange conveyor transfers the bin to an end 281 of the exchange conveyor. When instructed by a controller 190 (shown in FIG. 1A) of a respective inspection system 200A-200C, a bin handler 150 actuates to engage the empty bin with an end effector 154 (shown in FIG. 1C) of the bin handler 150. Upon receiving an instruction that a bin of the sorting unit 106 is nearly full, the bin handler 150, carrying an empty bin, actuates into position adjacent the nearly full bin. Once full, an empty (or free) end effector 154 of the bin handler 150 engages the full bin and removes the full bin from the sorting unit 106. The bin handler 150 then rotates to position the empty bin (on an end effector 154) thereof adjacent the open position (created by removal of the full bin) of the sorting unit 106, and positions the empty bin in the open position. Sorting continues, using the empty bin.

With the full bin still engaged by one of the end effectors 154 of the bin handler 150, the bin handler 150 rotates to a position adjacent the exchange conveyor 270. The bin handler 150 then deposits the full bin on the end 281 of the exchange conveyor 270, and the exchange conveyor subsequently transfers the full bin to the end 283 of the exchange conveyor 270. The full bin is then transferred to the conveyor 273 and transported to a predetermined location within the fabrication plant 290 on the conveyor 273. While FIG. 2 illustrates one example of a fabrication plant 290, other configurations are also contemplated.

While aspects herein described with respect to rotary sorters, it is contemplated that aspects herein may also be applied to linear sorters.

In summary, aspects of the disclosure automate and improve removal, transfer, and exchange of bins on sorting units. Aspects described herein reduce the likelihood of substrate damage by bin exchange. It is contemplated that removal and replacement of bins with the bin handler occurs more quickly than can be accomplished manually. Thus, damage to substrates which can occur due to slow removal and replacement of bins is mitigated. Additionally, aspects herein mitigate human error, further reducing the likelihood of damaged substrates.

While the foregoing is directed to aspects of the present disclosure, other and further aspects of the disclosure may be devised without departing from the basic scope thereof, and the scope thereof is determined by the claims that follow.

What is claimed is:

1. A sorting unit, comprising:
    a sorting system;
    a plurality of bins arranged in a circular configuration into which substrates are sorted by the sorting system; and
    a bin handler having a first end effector for receiving one bin of the plurality of bins, and second end effector for disposing an empty bin in the previous location of the received bin, wherein the bin handler is configured to move the first end effector and the second end effector in an arcuate path.

2. The sorting unit of claim 1, wherein the arcuate path of the first end effector and the second end effector is radially outward of the circular configuration of the plurality of bins.

3. The sorting unit of claim 2, wherein the first end effector and the second end effector are configured to move simultaneously around the arcuate path.

4. A sorting unit, comprising:
    a sorting system;
    a plurality of bins into which substrates are sorted by the sorting system; and
    a bin handler having a first end effector for receiving one bin of the plurality of bins, and second end effector for disposing an empty bin in the previous location of the received bin, wherein the bin handler includes a rotating horizontal cross bar and a vertical coupling member extending from the horizontal cross bar, the first end effector and the second end effector coupled to a distal end of the vertical coupling member.

5. The sorting unit of claim 4, wherein the sorting system comprises a rotatable support having a plurality of substrate grippers coupled thereto, the substrate grippers positioned vertically above the plurality of bins.

6. The sorting unit of claim 5, further comprising a linear conveyor positioned beneath the rotatable support.

7. An inspecting system, comprising:
    a loading unit;
    a modular unit including one or more metrology stations; and
    a sorting unit, comprising:
        a sorting system;
        a plurality of bins arranged in a circular configuration into which substrates are sorted by the sorting system; and
        a bin handler having a first end effector for receiving one bin of the plurality of bins, and second end effector for disposing an empty bin in the previous location of the received bin wherein the bin handler is configured to move the first end effector and the second end effector in an arcuate path.

8. The inspection system of claim 7, further comprising a linear conveyor extending from the loading unit, through the modular unit, and to the sorting unit.

9. The inspection system of claim 7, wherein the arcuate path of the first end effector and the second end effector is radially outward of the circular configuration of the plurality of bins.

10. The inspection system of claim 9, wherein the first end effector and the second end effector are configured to move simultaneously around the arcuate path.

11. An inspecting system, comprising:
    a loading unit;
    a modular unit including one or more metrology stations; and
    a sorting unit, comprising:
        a sorting system;
        a plurality of bins into which substrates are sorted by the sorting system; and
        a bin handler having a first end effector for receiving one bin of the plurality of bins, and second end effector for disposing an empty bin in the previous location of the received bin, wherein the bin handler includes a rotating horizontal cross bar and a vertical coupling member extending from the horizontal cross bar, the first end effector and the second end effector coupled to a distal end of the vertical coupling member.

12. The inspection system of claim 11, wherein the sorting system comprises a rotatable support having a plurality of substrate grippers coupled thereto, the substrate grippers positioned vertically above the plurality of bins.

13. A method of operating a sorting unit, comprising:
    sorting a plurality of substrates into a respective bin of a plurality of bins arranged in a circular configuration, based on inspection criteria;
    determining that one of the bins of the plurality of bins is in a full or near-full state;

in response to the determination, engaging an empty bin with a first end effector of a bin handler, and moving the bin handler with the empty bin adjacent to the full or near-full bin;

engaging the full or near-full bin with a second end effector of the bin handler; and replacing the full or near-full bin with the empty bin.

14. The method of claim 13, further comprising positioning the full or near-full bin on a conveyor.

15. The method of claim 14, wherein the engaging the empty bin comprises removing the empty bin from the conveyor.

16. The method of claim 13, further comprising rotating the first end effector and the second end effector prior to engaging the full or near-full bin.

17. A method of operating a sorting unit, comprising:

sorting a plurality of substrates into a respective bin of a plurality of bins based on inspection criteria;

determining that one of the bins of the plurality of bins is in a full or near-full state;

in response to the determination, engaging an empty bin with a first end effector of a bin handler, and moving the bin handler with the empty bin adjacent to the full or near-full bin, wherein the bin handler includes a rotating horizontal cross bar and a vertical coupling member extending from the horizontal cross bar, the first end effector and a second end effector coupled to a distal end of the vertical coupling member;

engaging the full or near-full bin with the second end effector of the bin handler; and replacing the full or near-full bin with the empty bin.

* * * * *